US012622066B2

(12) United States Patent (10) Patent No.: US 12,622,066 B2
Slaton et al. (45) Date of Patent: May 5, 2026

(54) RESONANCE CANCELLATION DEVICES AND METHODS

(71) Applicant: pSemi Corporation, San Diego, CA (US)

(72) Inventors: Joseph Porter Slaton, San Diego, CA (US); Parvez Daruwalla, Fremont, CA (US)

(73) Assignee: PSEMI CORPORATION, San Diego, CA (US)

( * ) Notice: Subject to any disclaimer, the term of this patent is extended or adjusted under 35 U.S.C. 154(b) by 342 days.

(21) Appl. No.: 18/343,316

(22) Filed: Jun. 28, 2023

(65) Prior Publication Data

US 2025/0007502 A1     Jan. 2, 2025

(51) Int. Cl.
| | |
|---|---|
| *H03K 17/687* | (2006.01) |
| *H02H 9/04* | (2006.01) |
| *H03K 17/06* | (2006.01) |
| *H10D 89/60* | (2025.01) |

(52) U.S. Cl.
CPC .......... *H10D 89/811* (2025.01); *H02H 9/046* (2013.01); *H03K 17/063* (2013.01); *H03K 17/687* (2013.01)

(58) Field of Classification Search
CPC .... H02H 9/046; H03K 17/063; H03K 17/687; H10D 89/60; H10D 89/811
USPC .......... 327/551, 552, 553, 554, 555; 361/56
See application file for complete search history.

(56) References Cited

U.S. PATENT DOCUMENTS

| | | | |
|---|---|---|---|
| 6,597,227 | B1 | 7/2003 | Yue |
| 8,369,053 | B2 | 2/2013 | Moronval et al. |
| 8,792,218 | B2 | 7/2014 | Tsai |
| 9,917,079 | B2 | 3/2018 | Tsai et al. |
| 2003/0102923 | A1 | 6/2003 | Vickram et al. |
| 2009/0195946 | A1 | 8/2009 | Kleveland |
| 2012/0105167 | A1 | 5/2012 | Min et al. |
| 2013/0241666 | A1 | 9/2013 | Granger-Jones et al. |
| 2014/0285931 | A1* | 9/2014 | Taft ........................ H02H 9/046 |
| | | | 361/56 |
| 2016/0164471 | A1* | 6/2016 | Shah ....................... H03F 1/565 |
| | | | 330/296 |
| 2025/0007508 | A1 | 1/2025 | Slaton |

FOREIGN PATENT DOCUMENTS

| | | |
|---|---|---|
| WO | 2025/006408 A1 | 1/2025 |

OTHER PUBLICATIONS

Invitation to Pay Additional Fees and, Where Applicable, Protest Fee and Partial Search Report issued for International PCT Application No. PCT/US2024/035311 filed on Jun. 24, 2024 on behalf of pSemi Corporation. Mail Date: Oct. 14, 2024. 13 pages.

* cited by examiner

*Primary Examiner* — William Hernandez
(74) *Attorney, Agent, or Firm* — Steinfl + Bruno LLP

(57) ABSTRACT

Ground impedance may have adverse effects on the performance of RF circuits that employ shunt switches. The disclosed methods and devices address this issue. The methods and devices involve the use of resonance-canceling inductors to counteract the capacitive reactance caused by parasitic capacitances and/or decoupling capacitors utilized in such systems. Solutions that incorporate series resistors to distribute the resonance across the frequency band of operation are also described. Additionally, devices that employ digitally tuned capacitors to shift the resonance frequency outside the operational band are presented.

21 Claims, 12 Drawing Sheets

RESONANCE CANCELLATION DEVICES AND METHODS

TECHNICAL FIELD

The present disclosure is related to resonance cancellation. More in particular, the disclosed methods and devices can be implemented in electronic circuits where storage and decoupling capacitors on input/output (I/O) pins resonate with the radio frequency (RF) ground.

BACKGROUND

RF switches have been used by RF engineers to implement a wide range of functions within RF circuits. For example, RF switches may be used in cellular phones to switch between different cellular bands. RF switches may also be used to selectively connection an antenna to a transmitter or a receiver. RF switches may be designed to provide isolation between signal paths, ensuring minimal interference and preserving signal quality. This capability is useful for minimizing cross-talk or spurious signals.

SUMMARY

The disclosed methods and devices address the above-mentioned performance degradation issues. According to the disclosed teachings, an inductor may be disposed on the IC or the PCB, the inductor being connected to the I/O pins in series with the decoupling capacitor. The inductance introduced by the added inductor will generate an inductive reactance that may fully or partially counteract the capacitive reactance of the decoupling capacitor. As a result, this approach can mitigate the performance degradation associated with resonance. In other words, by fully or partially cancelling the capacitive reactance of the decoupling capacitor, the resonant frequency of the parallel LC resonance is either substantially reduce or shifted out of the designed operational frequency band of the RF shunt switch and as a result, the negative impact of the resonance on the ON-resistance (Ron) of the RF shunt switch will be reduced or eliminated.

According a first aspect of the present disclosure, a circuital arrangement is provided, comprising an integrated circuit (IC), the IC comprising: a shunt switch; a decoupling capacitance connecting a source terminal of the switch to a first pin of the IC; a storage capacitance disposed outside the IC and coupled to the first pin of the IC; a resonance-canceling inductance disposed outside the IC and in series with the storage capacitance; wherein: the storage capacitance acts as an alternating current (AC)-short circuit across an operational frequency band of the IC; the resonance-canceling inductance is configured to cancel or attenuate a parasitic resonance, by a combination of i) a series arrangement of a parasitic ground inductance inside the IC and a parasitic ground inductance outside the IC with ii) a parallel arrangement of the decoupling capacitance and a parasitic capacitance, the parasitic resonance to be canceled or reduced occurring at a frequency within an operational frequency band of the circuital arrangement.

According to a second aspect of the present disclosure, a circuital arrangement is provided, comprising an integrated circuit (IC), the IC comprising: a shunt switch; a decoupling capacitance connecting a source terminal of the switch to a first pin of the IC; a storage capacitance disposed outside the IC and coupled to the first pin; a resonance-canceling inductance disposed inside the IC and in series with the decoupling capacitance; wherein: the storage capacitance acts as an alternating current (AC)-short circuit across an operational frequency band of the IC; the resonance-canceling inductance is configured to cancel or attenuate a parasitic resonance, by a combination of i) a series arrangement of a parasitic ground inductance inside the IC and a parasitic ground inductance outside the IC with ii) a parallel arrangement of the decoupling capacitance and a parasitic capacitance, the parasitic resonance to be canceled or reduced occurring at a frequency within an operational frequency band of the circuital arrangement.

According to a third aspect of the present disclosure, a circuital arrangement is provided, comprising an integrated circuit (IC), the IC comprising: a shunt switch; a decoupling capacitance connecting a source terminal of the switch to a first pin of the IC; a storage capacitance disposed outside the IC and coupled to the first pin of the IC; a resistor disposed inside the IC and in series with the storage capacitance; wherein: the storage capacitance acts as an alternating current (AC)-short circuit across an operational frequency band of the IC; the resistor is configured to attenuate a parasitic resonance, by a combination of i) a series arrangement of a parasitic ground inductance inside the IC and a parasitic ground inductance outside the IC with ii) a parallel arrangement of the decoupling capacitance and a parasitic capacitance, by spreading the parasitic resonance across an operational frequency band of the circuital arrangement.

According to a fourth aspect of the present disclosure, a method of canceling or attenuating a resonance generated in a radio frequency (RF) integrated circuit (IC) circuit is disclosed, the IC including: a shunt switch, and a decoupling capacitance connecting a source terminal of the switch to a pin of the IC; the method comprising: connecting, outside the IC, a storage capacitance to the pin of the IC, the storage capacitance being an alternating current (AC)-short across an operational frequency band of the IC; applying an input RF voltage to a drain terminal of the shunt switch, thereby generating a parasitic resonance based on a combination of i) a series arrangement of a parasitic ground inductance inside the IC and a parasitic ground inductance outside the IC with ii) a parallel arrangement of the decoupling capacitance and a parasitic capacitance; disposing a resonance-canceling inductance outside the IC and in series with the storage capacitance to cancel or attenuate the parasitic resonance.

Further aspects of the disclosure are provided in the description, drawings and claims of the present application.

DESCRIPTION OF THE DRAWINGS

Like reference numbers and designations in the various drawings indicate like elements.

DETAILED DESCRIPTION

Throughout this document, the phrase "in the absence of an inductor" refers to the condition when the inductor is replaced by either a short circuit or a wire with no resistance. For instance, the term "the resonance generated in the absence of the resonance-canceling inductor" shall denote the resonance produced when the resonance-canceling inductor is not implemented or, stated differently, is replaced with either a short circuit or a wire with no resistance.

In RF systems that use shunt switches, the ground impedance can have a detrimental effect on the system performance by de-Qing, i.e., degrading the quality factor (Q-factor), of the short or the component(s) that the RF shunt switch is designed to actuate. In general, the ground impedance manifests as a relatively low resistance and inductance, which has negligible impact on the overall system performance. However, in some applications where radio frequency (RF) integrated circuits (ICs) are implemented, the ground inductance may resonate with the decoupling capacitor placed on an analog input/output (I/O) pin of the IC, the I/O pin being also connected to a large storage cap that acts as a short at RF frequencies. Such parallel LC resonance essentially occurs between the on-chip (inside the IC) capacitances and the combination of the on-chip (inside the IC) and off-chip (outside the IC) parasitic inductances. As a result, an undesired real impedance at the system operational frequencies may be generated, and this may cause an overall degradation of the system performance.

Figure 1:
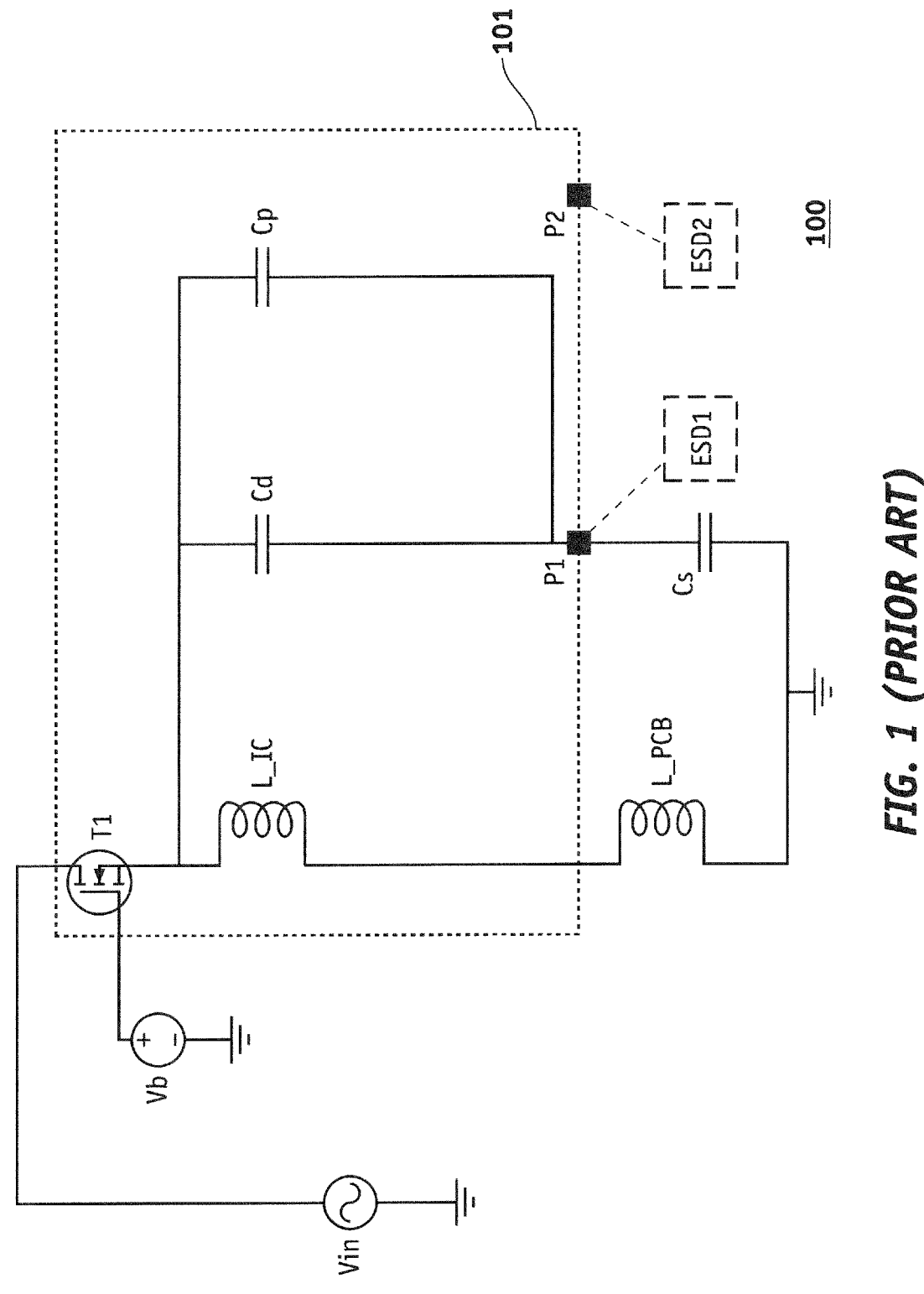
FIG. 1 shows a prior art circuital arrangement representing a portion of an RF system.

In order to further clarify the above-mentioned performance degradation issue, reference is made to FIG. 1 showing a prior art circuital arrangement (100), representing a portion of an RF system, the circuital arrangement including IC (101) disposed on a printed circuit board (not shown). IC (101) includes transistor (T1), essentially a shunt switch, and decoupling capacitor (Cd). Transistor (T1) is biased through off-chip bias voltage (Vb) and is configured to receive RF input voltage (Vin). Two pins (P1, P2) of the IC (101) are also shown. Optional on-chip electrostatic discharge protection (ESD) devices (ESD1, ESD2) are connected to terminals or pins (P1, P2), respectively. Circuital arrangement (100) further includes an off-chip storage capacitor (Cs) connected to pin (P1). Such a storage capacitor is large enough to act as an AC short at operational frequencies of the arrangement. Pin (P2) may be optionally connected to output buffers, I/O elements or other elements of the RF system, none of such elements being shown, for better clarity of the drawing. Parasitic capacitances generated by various elements such as ESD devices, pin drivers, and I/O elements are all lumped together and represented by parasitic capacitor (Cp). It is understood that capacitor (Cp) is not a physical element, but rather a representation of parasitic capacitances generated by various elements of the system. Similarly, on-chip parasitic inductances are represented by a series arrangement of the on-chip parasitic inductor (L_IC) and the off-chip parasitic inductor (L_PCB). Again, here the off-chip and on-chip inductors as shown, are not physical elements, but rather a representation of parasitic inductances affecting the IC's performance. In operative conditions, when RF voltage (Vin) is applied, storage capacitor (Cs) acts as an AC short.

With continued reference to FIG. 1, depending on the operational frequency and the inductance and capacitance values of various elements, a combination of the on-chip and off-chip inductors (L_IC, L_PCB) in parallel with a combination of capacitors (Cd, Cp) may generate a parallel LC resonance. The generated resonance will cause an increase of the ON resistance (Ron) of transistor (T1), thus degrading the overall performance of the RF system as described previously.

Figure 2A:
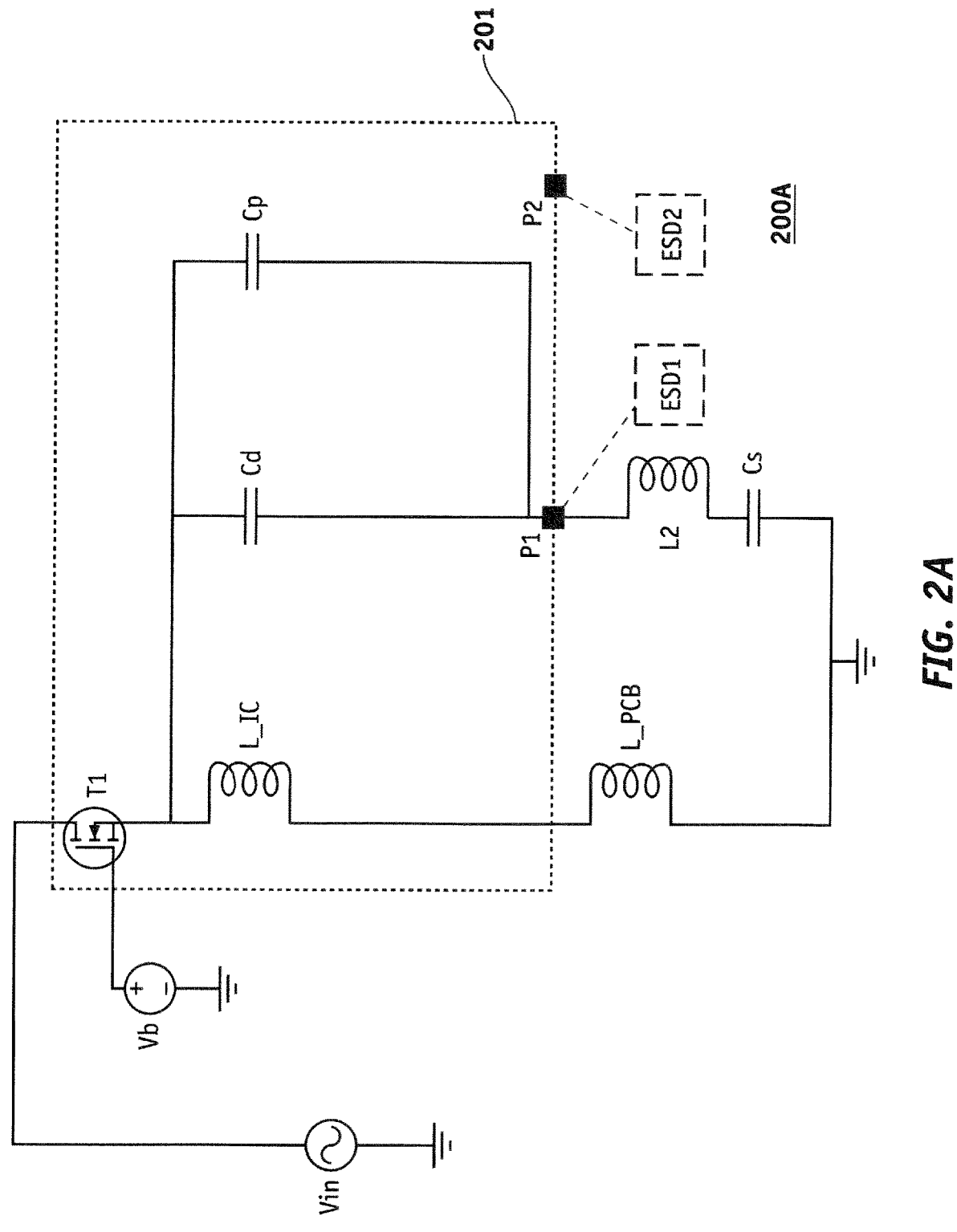
FIGS. 2A-2J shows example circuital arrangements in accordance with embodiments of the present disclosure.

FIG. 2A shows an example circuital arrangement (200A) in accordance with an embodiment of the present disclosure. Circuital arrangement (200A) represents a portion of an RF system and is similar to the circuital arrangement (100) of FIG. 1 except for the addition of inductor (L2). Such inductor is disposed off-chip (i.e., outside the integrated circuit or chip (201)), connected to pin (P1), and in series with the decoupling capacitor (Cd) and storage capacitor (Cs). The inductance of inductor (L2) may be selected such that the resulting inductive reactance would cancel, partially or fully, the capacitive reactance of the combination of decoupling and parasitic capacitors (Cd, Cp). In other words, the parallel LC resonance as previously described is mostly eliminated and its negative impact on the ON resistance (Ron) of transistor (T1) is substantially reduced. As inductor (L2) is placed downstream of pin (P1), the parasitic capacitance due to ESD device (ESD1) can also be addressed and compensated for, when implementing inductor (L2) as such.

Figure 2B:
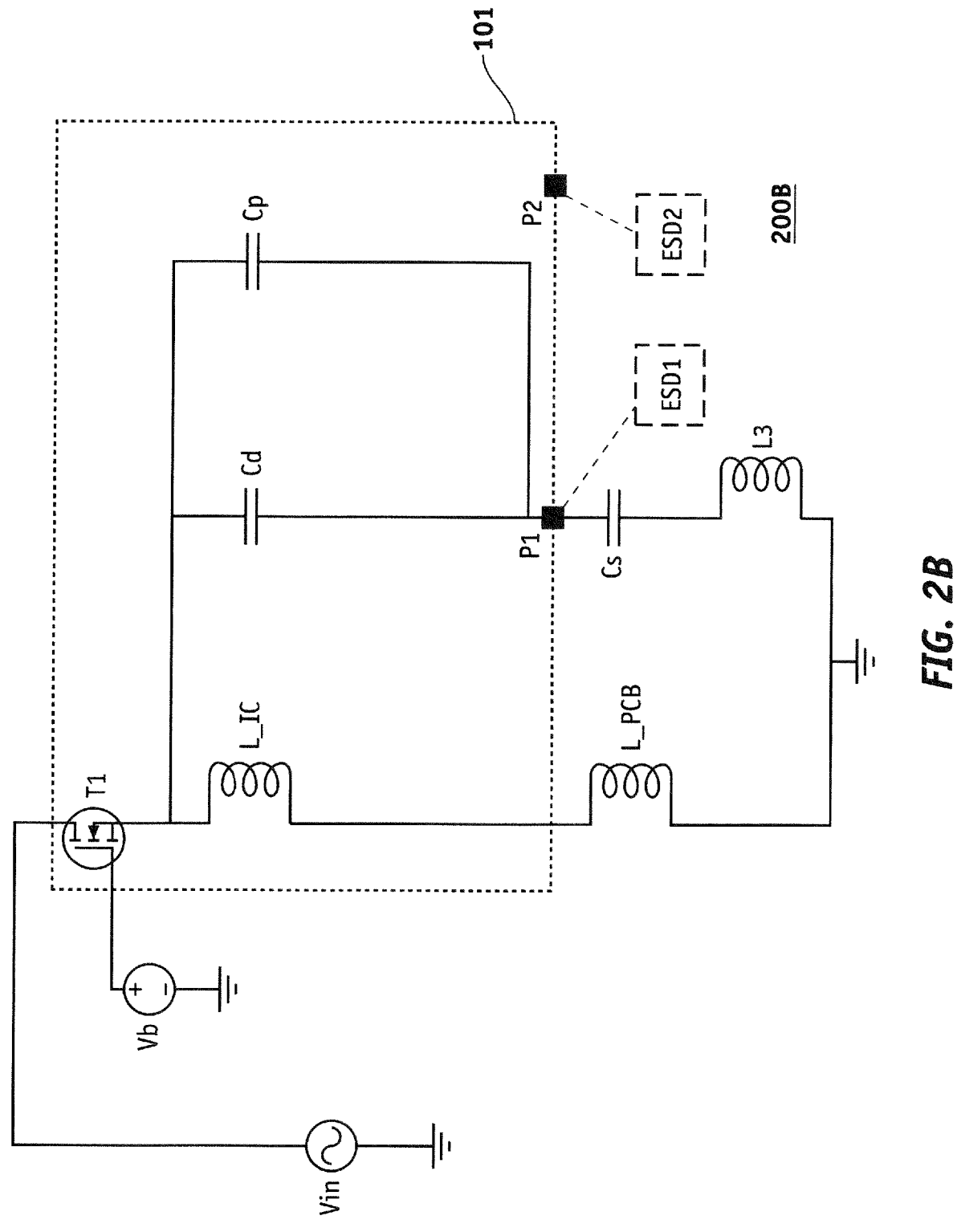

FIG. 2B shows an example circuital arrangement (200B) in accordance with an embodiment of the present disclosure. Circuital arrangement (200B) represents a portion of an RF system and is similar to the circuital arrangement (200A) of FIG. 2A except that this time the inductor (referred here as L3) is placed not only off-chip, but also downstream of storage capacitor (Cs). Inductor (L3) has the same functionality as inductor (L2) of FIG. 2A, i.e., canceling the capacitive reactance due to capacitors (Cd, Cp) to avoid the previously described parallel LC resonance and its undesired impact on the overall performance of the RF system.

Figure 2C:
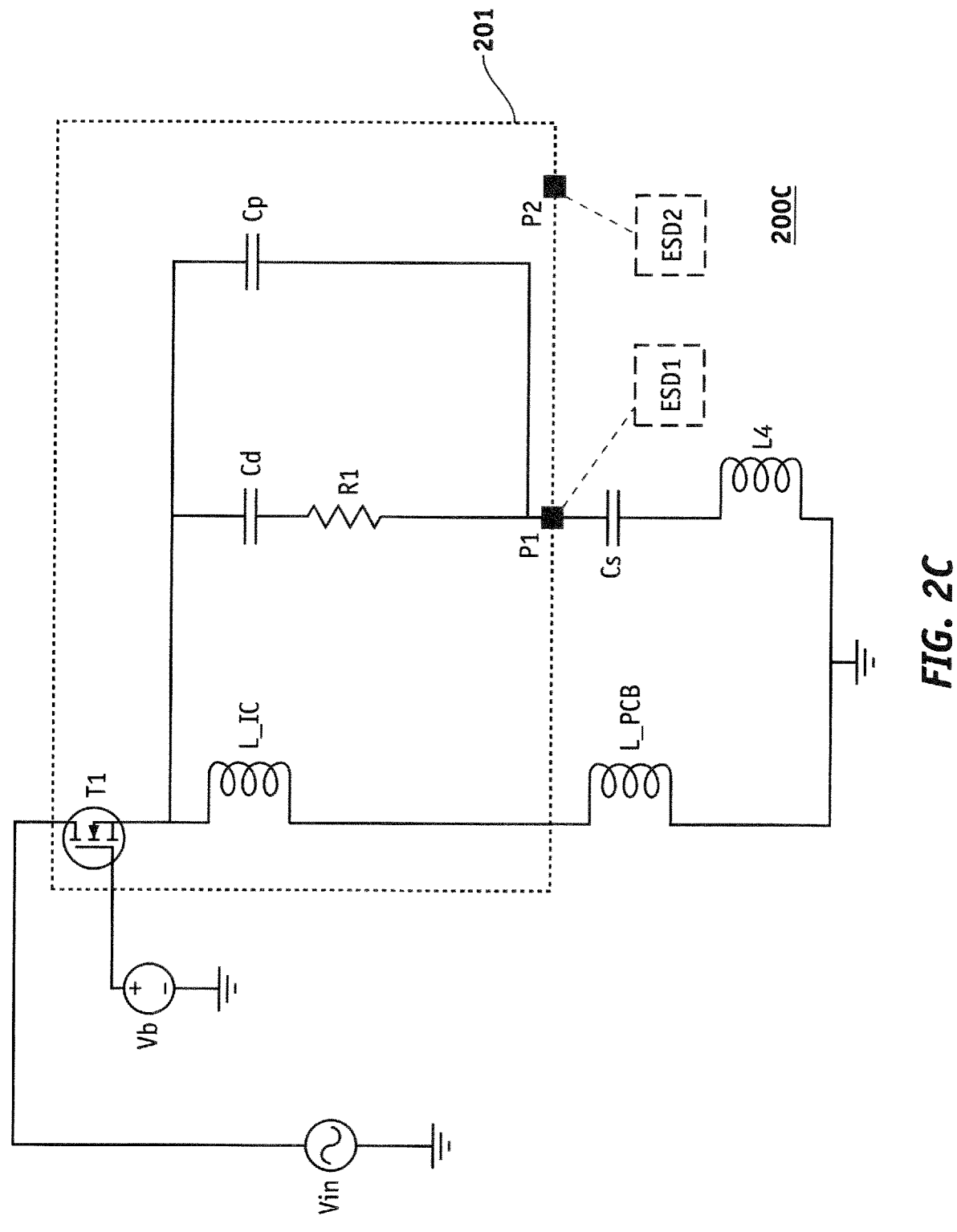

FIG. 2C shows an example circuital arrangement (200C) in accordance with an embodiment of the present disclosure. Circuital arrangement (200C) represents a portion of an RF system and is similar to the circuital arrangement (200B) of FIG. 2B, except for the addition of resistor (R1). Such resistor is disposed on-chip, connected to pin (P1), and in series with the decoupling capacitor (Cd). Resistor (R1) is essentially a de-Qing resistor, serving to spread the resonance over frequencies, thus mitigating the adverse impact of the resonance on the system performance.

Figure 2D:
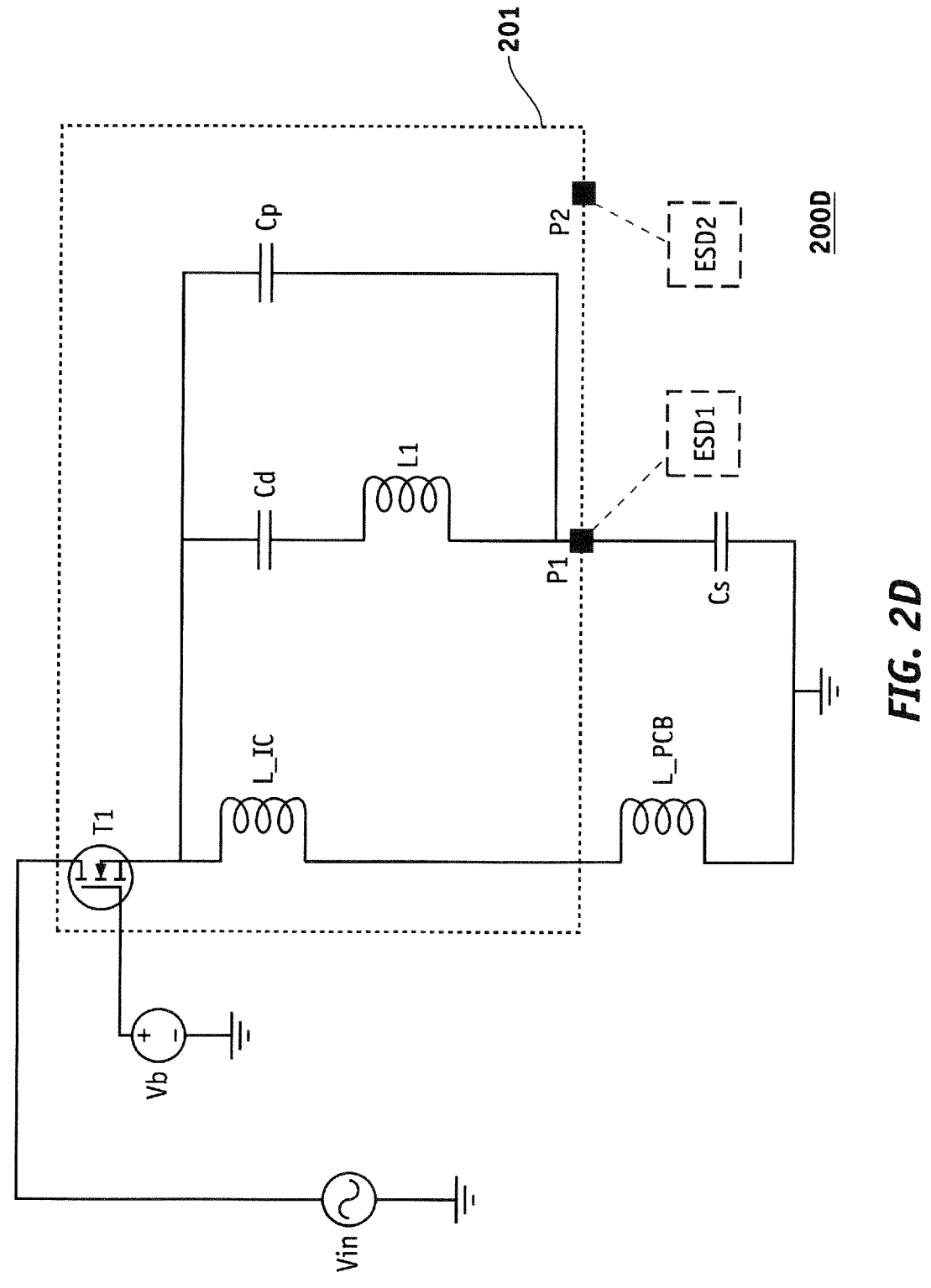

FIG. 2D shows an example circuital arrangement (200D) in accordance with an embodiment of the present disclosure. Circuital arrangement (200D) represents a portion of an RF system and is similar to the circuital arrangement (100) of FIG. 1 except for the addition of inductor (L1). Such inductor is disposed on-chip, connected to pin (P1), and in series with the decoupling capacitor (Cd). In contrast with the embodiment of FIG. 2A, as inductor (L1) is disposed upstream of pin (P1), the parasitic capacitance due to ESD device (ESD1) is not factored in when selecting the inductance of inductor (L1).

Figure 2E:
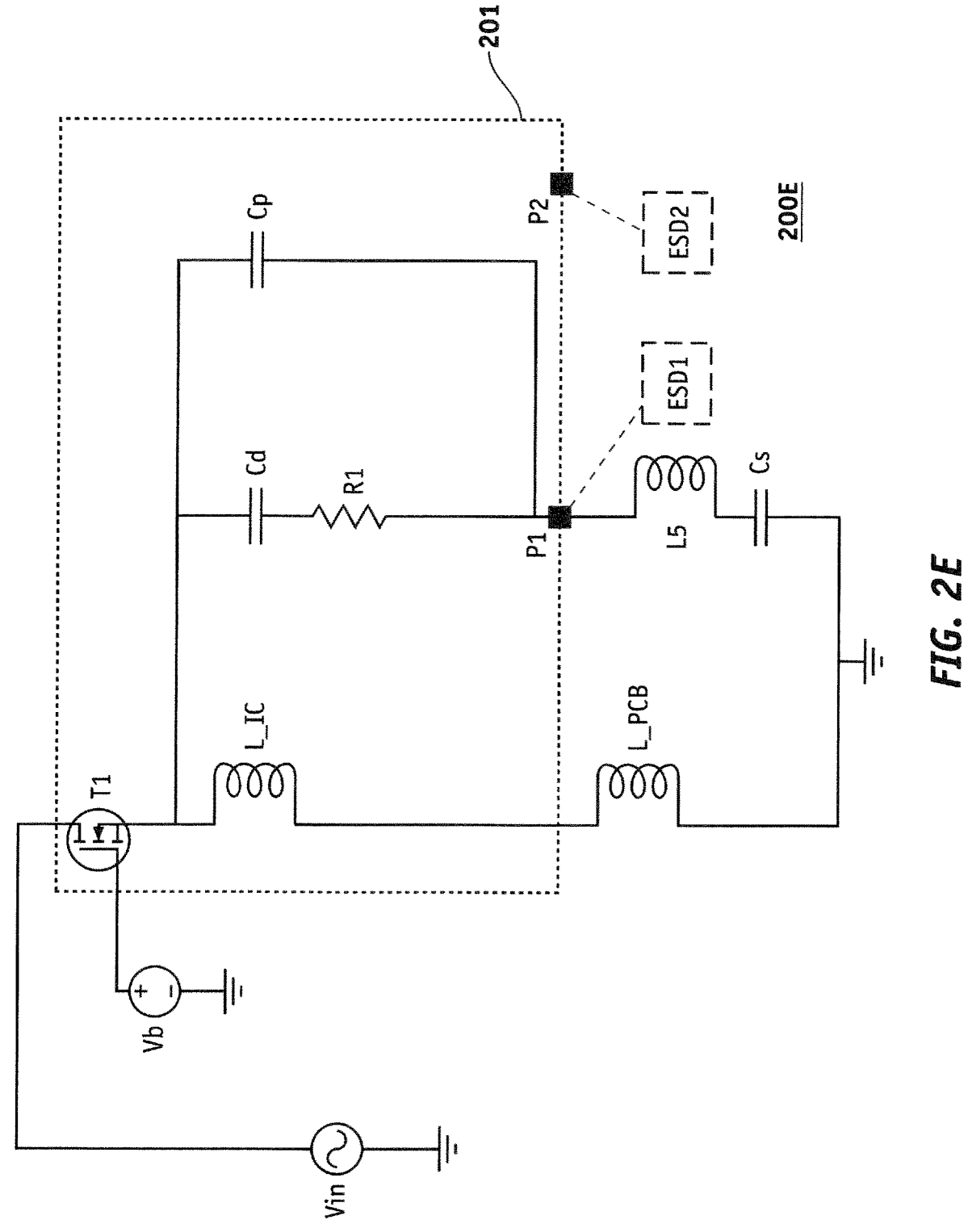

FIG. 2E shows an example circuital arrangement (200E) in accordance with an embodiment of the present disclosure. Circuital arrangement (200E) represents a portion of an RF system and is similar to the circuital arrangement (200A) of FIG. 2A, except for the addition of resistor (R1). Such resistor is disposed on-chip, connected to pin (P1), and in series with the decoupling capacitor (Cd). Resistor (R1) is essentially a de-Qing resistor, serving to spread the resonance over frequencies, thus reducing the system performance degradation due to such resonance. The off-chip inductor of FIG. 2E is indicated as (L5) in the figure.

Figure 2F:
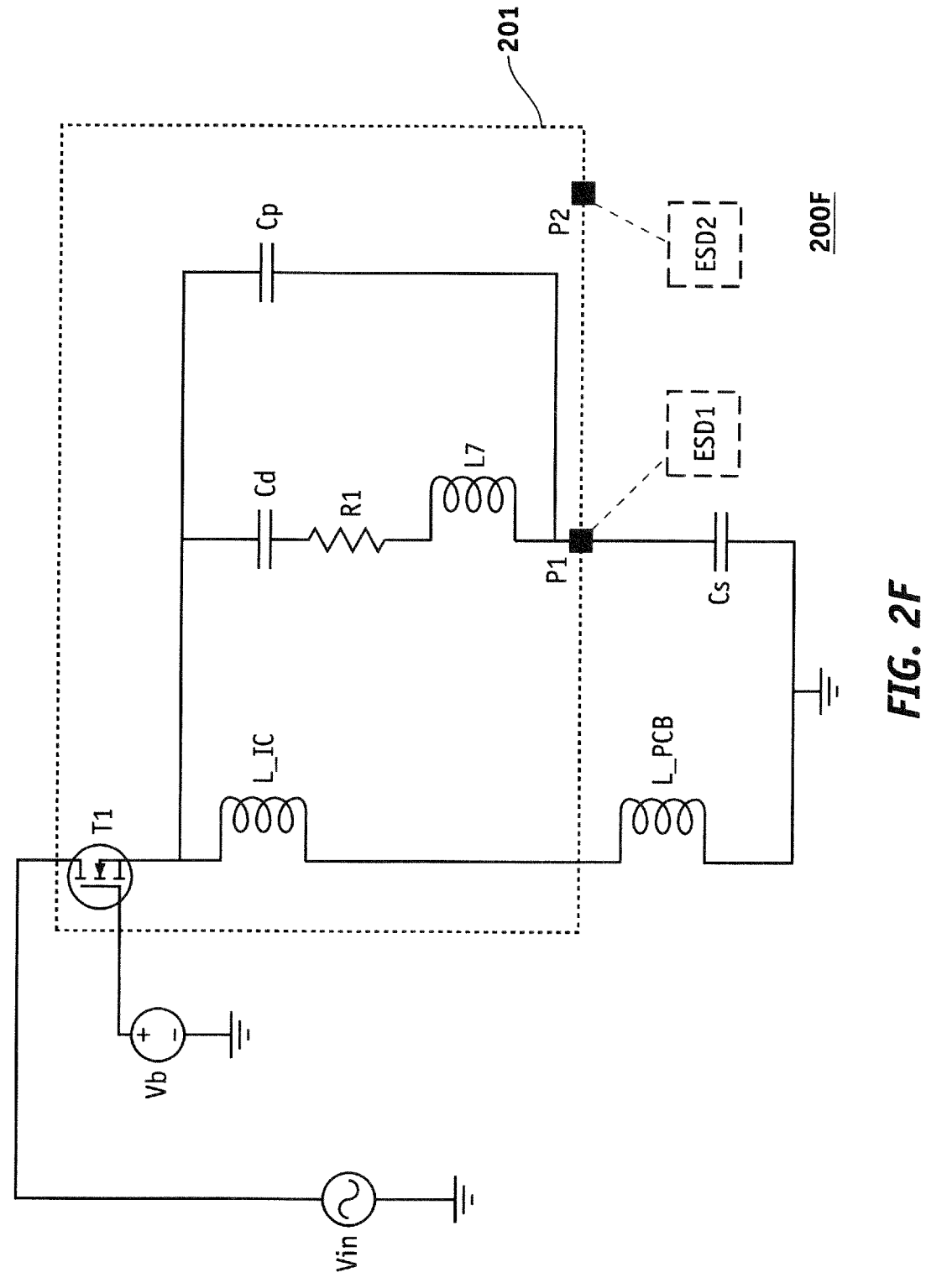

FIG. 2F shows an example circuital arrangement (200F) in accordance with an embodiment of the present disclosure. Circuital arrangement (200F) represents a portion of an RF system and is similar to the circuital arrangement (200D) of FIG. 2D, except for the addition of resistor (R1). The placement and functionality of such resistor is similar to what was described with regards to the embodiments of FIGS. 2C, and 2E. The on-chip inductor of FIG. 2F is indicated as (L7) in the figure.

Figure 2G:
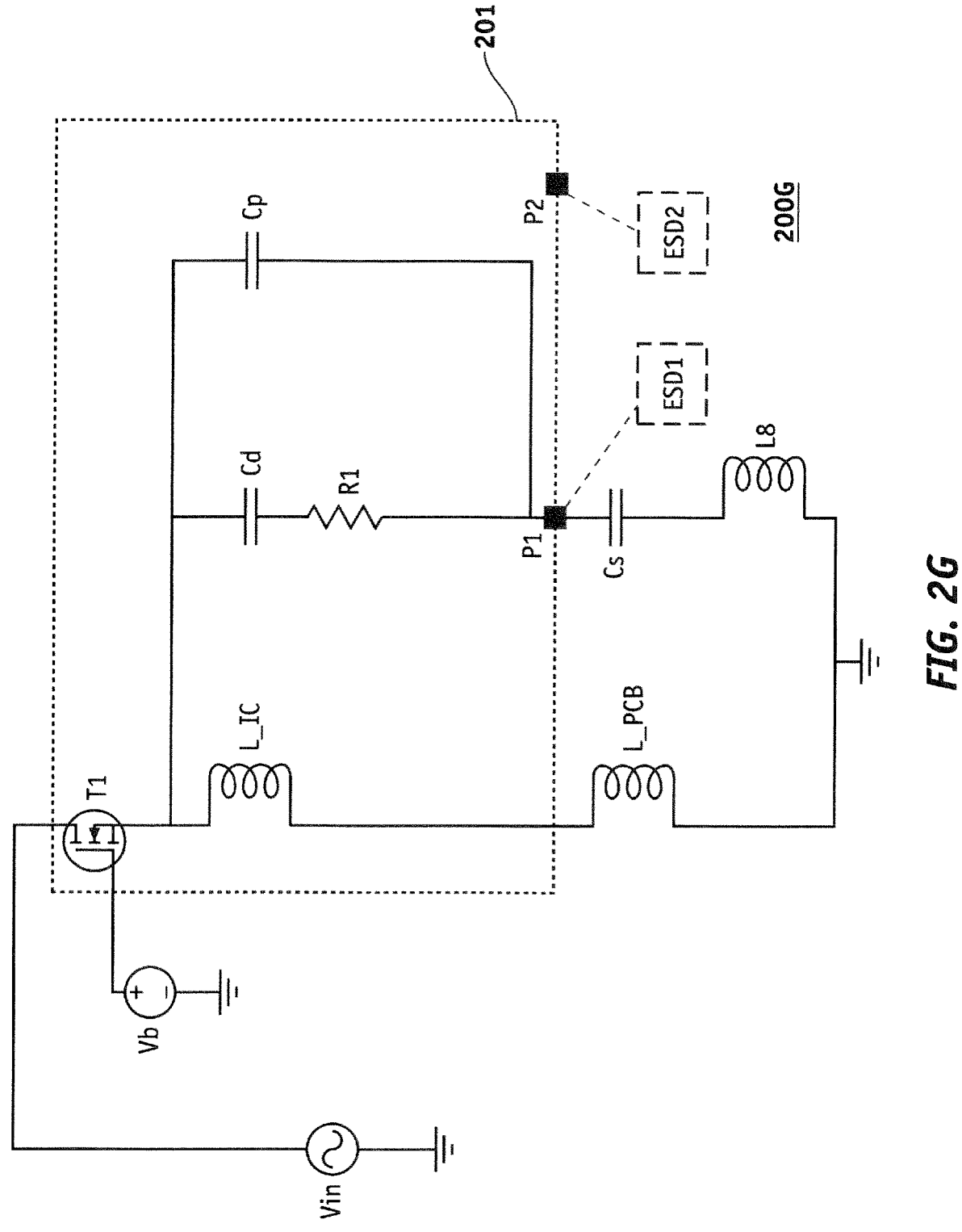

FIG. 2G shows an example circuital arrangement (200G) in accordance with an embodiment of the present disclosure. Circuital arrangement (200G) represents a portion of an RF system and is similar to the circuital arrangement (200B) of FIG. 2B, except for the addition of resistor (R1). The placement and functionality of such resistor is similar to what was described with regards to the embodiments of FIGS. 2C, and 2E-2F. The off-chip inductor of FIG. 2G is indicated as (L8) in the figure.

Figure 2H:
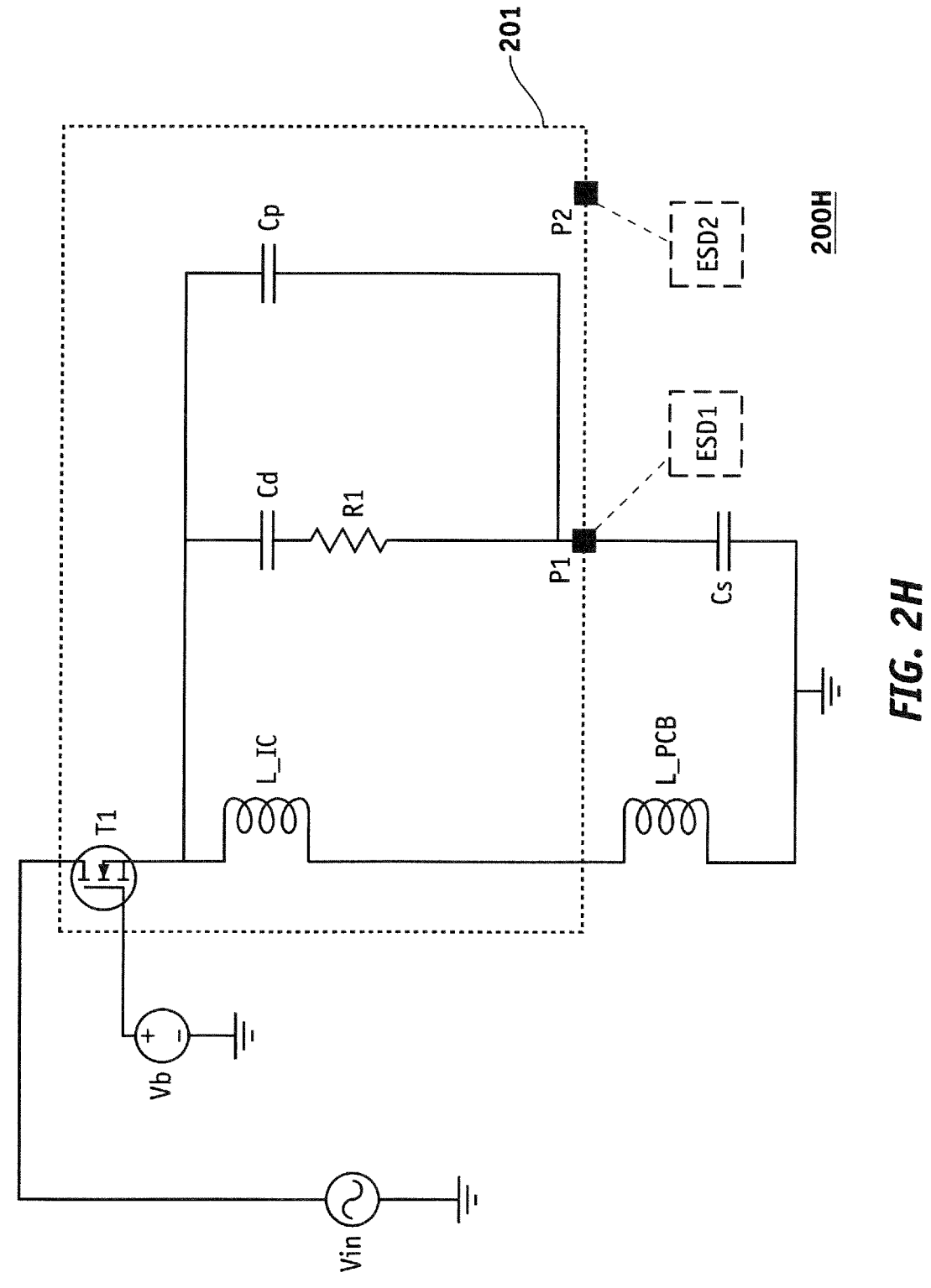

FIG. 2H shows an example circuital arrangement (200H) in accordance with an embodiment of the present disclosure. Circuital arrangement (200H) represents a portion of an RF system and is similar to the circuital arrangement (100) of FIG. 1, except for the addition of resistor (R1). In contrast with the embodiments described so far, this embodiment does not implement any additional inductor. This is a tradeoff between the resulting performance and occupied space. Inductors need large space to be implemented and this would be prohibitive in some applications. By only adding an on-chip resistor, the resonance is spread out along frequencies and the performance issues related to resonance are mitigated to some extent, while less die space is required for the design.

In reference to the disclosed embodiments, it should be noted that the parasitic capacitances could vary across different systems. Referring to, for example, FIG. 2A, in some applications, pins (P1, P2) may be swappable. While in the embodiment of FIG. 2A storage capacitor (Cs) is connected to pin (P1) and some I/O elements are connected to pin (P2), in a different embodiment a distinct arrangement can be envisioned, i.e. storage capacitor (Cs) may be connected to pin (P2) and I/O elements to pin (P1). Moreover, the printed circuit boards (PCBs) used to host the IC may be different across various systems. In view of all this, the parasitic capacitances may differ from one system to another, and it is desirable to have a solution addressing such variations. According to the teachings of the present disclosure, a solution to this issue is to implement tunable decoupling capacitors.

Figure 2I:
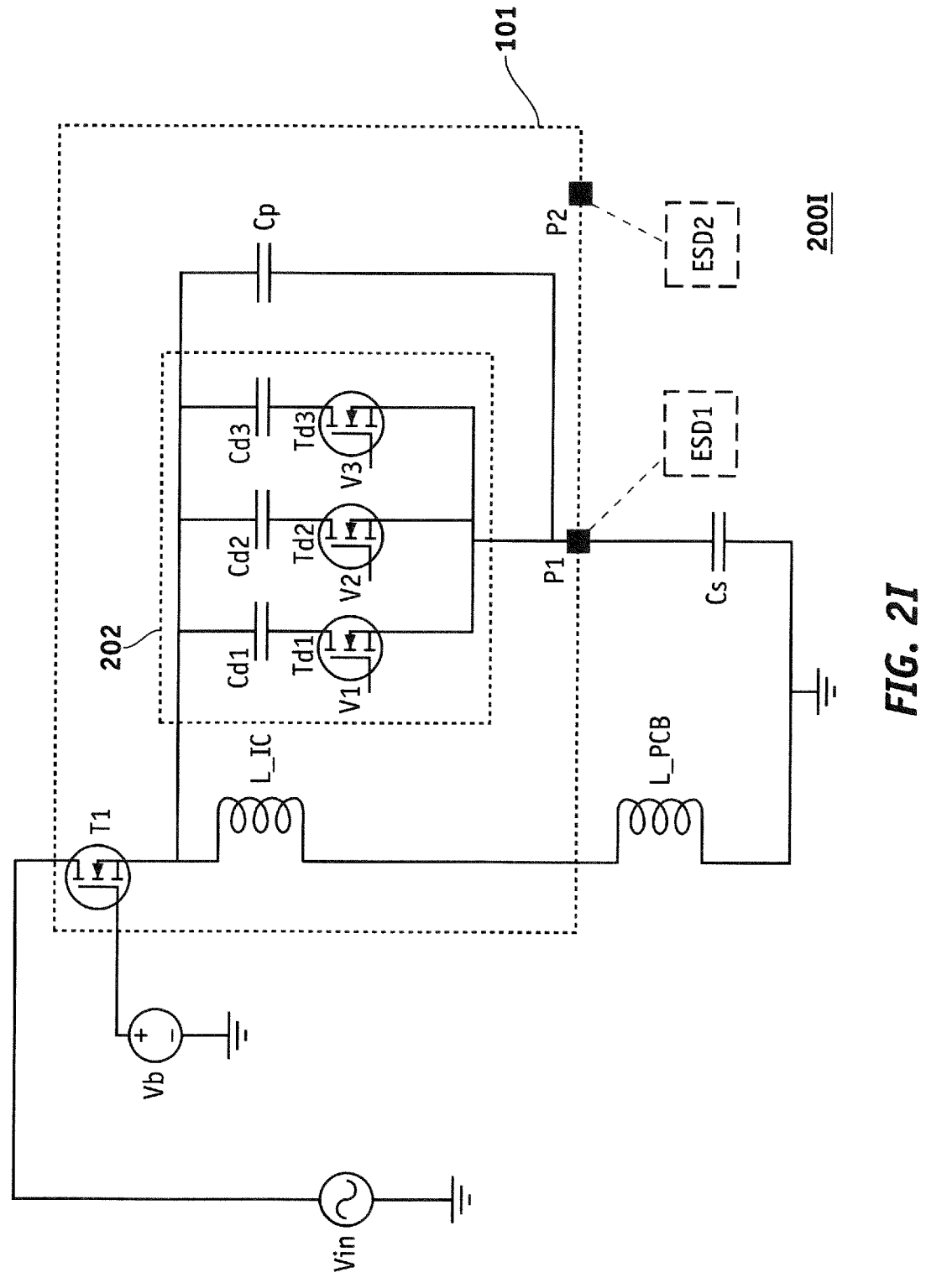

FIG. 2I shows an example circuital arrangement (200I) in accordance with an embodiment of the present disclosure. This arrangement implements a digital tunable capacitor, DTC (202) which includes multiple transistors (e.g., Td1, Td2, Td3) receiving their respective bias voltages (V1, V2, V3). Such bias voltages are used to control the transistors by independently turning them on or off. As a result, capacitors (Cd1, Cd2, Cd3) will be switched in or out to adjust the overall decoupling capacitance. Based on this approach, the resonance frequency can be shifted around to address the previously mentioned variability across systems. DTC (202) may include two or more transistors and two or more corresponding capacitors. According to the teachings of the present disclosure, all of the embodiments of FIGS. 2A-2H can also implement a DTC instead of a fixed decoupling capacitor to improve design flexibility. In any of the embodiments of FIGS. 2A-2H, the added inductor and/or resistor may be adjustable, meaning that such elements may be variable or switchable to make the design even more flexible.

Figure 2J:
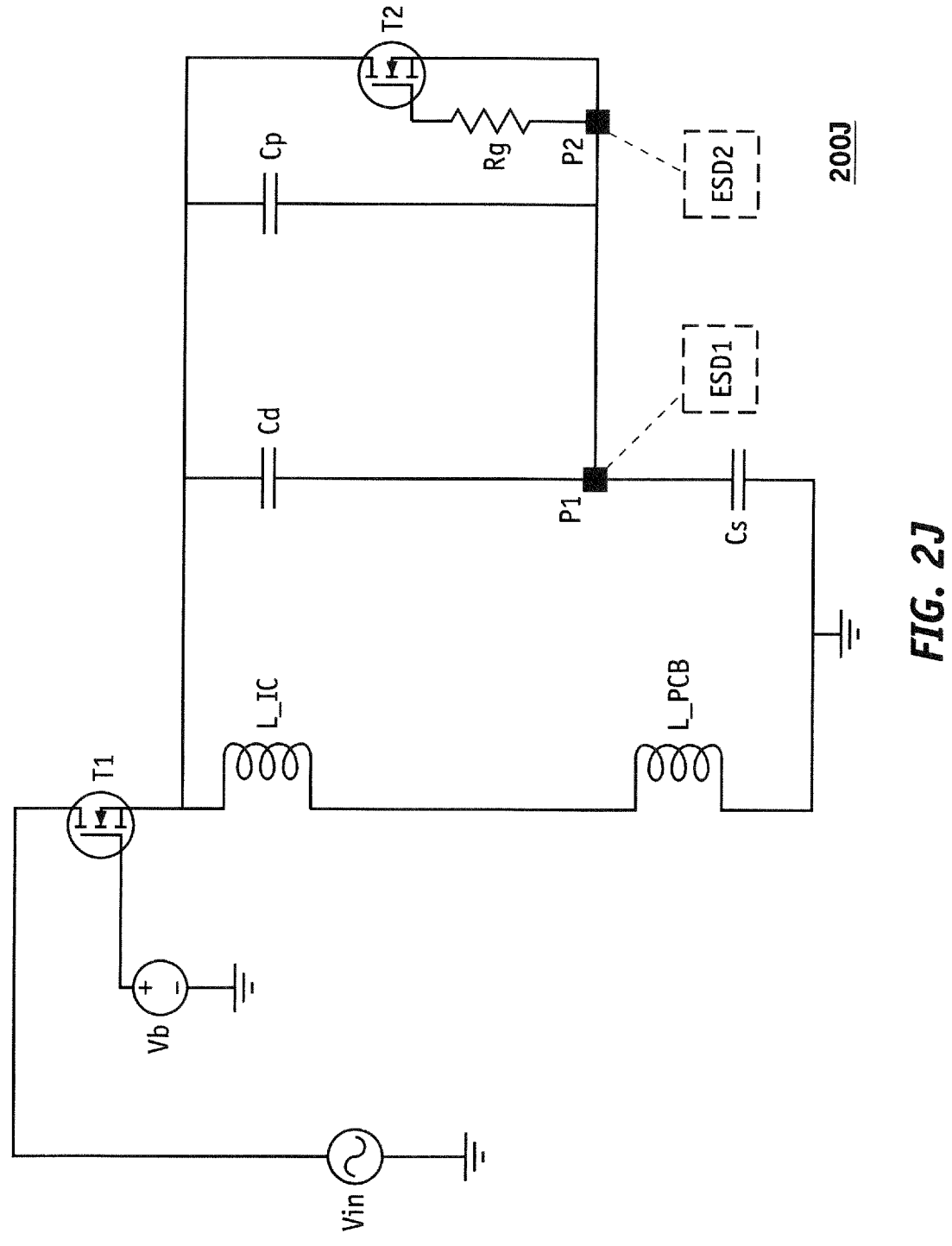

FIG. 2J shows an example circuital arrangement (200J) in accordance with an embodiment of the present disclosure. Circuital arrangement (200J) represents a portion of an RF system and is similar to the circuital arrangement (100) of FIG. 1 except for the addition of transistor (T2) with a series gate resistor (Rg). Transistor (T2) represents essentially an ESD protection device utilizing a higher trigger voltage than one that would be selected for optimal ESD protection so that it gains some immunity from being triggered inadvertently by the RF voltage across the possible LC resonance of pin (P1) or pin (P2).

Figure 3:
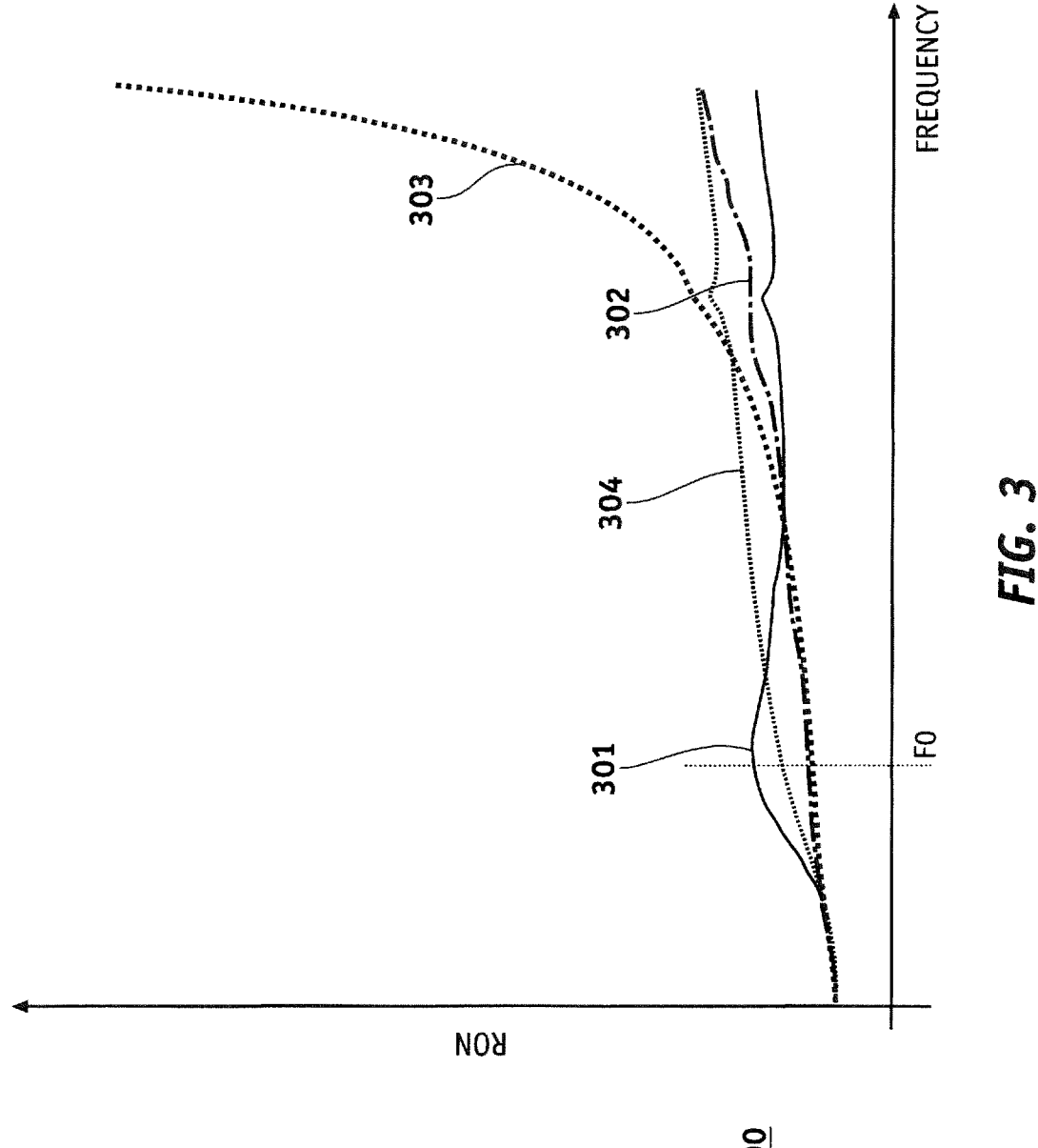
FIG. 3 shows an example graph in accordance with the teachings of the present disclosure, the graph illustrating the variations of the ON resistance of a shunt switch vs. frequency for various disclosed embodiments.

FIG. 3 shows an example graph (300) in accordance with an embodiment of the present disclosure. With reference to the disclosed embodiments, the shown curves represent the variations of the Ron of transistor (T1) vs. frequency for different embodiments. Curve (301) illustrates the case where no resonance-cancellation is applied, i.e. the prior art case of FIG. 1. As can be noticed, the undesired resonance as previously described is occurring at frequency (FO). Curve (302) corresponds to the embodiment of FIG. 2A where resonance-canceling inductor (L2) is implemented downstream of pin (P1), thus mitigating the on-chip parasitic capacitances including the parasitic capacitance due to ESD device (ESD1). Curve (303) corresponds to the embodiment of FIG. 2D where the resonance-canceling inductor (L1) is implemented on-chip and upstream of pin (P1). As such, this scheme does not compensate for the parasitic capacitance caused by the ESD device (ESD1), and as a result, an increase in Ron can be noticed at higher frequencies. Curve (304) corresponds to the case where no resonance-canceling is implemented but instead a resistor is used to spread the resonance across the frequencies, i.e. embodiment of FIG. 2H. This scheme is suitable for the applications where implementing an inductor or the integration of an inductor may be prohibitive due to stringent cost and/or space constraints.

In accordance with the teachings of the present disclosure and without departing from the fundamental scope and spirit of the invention, in all of the described embodiments, the storage capacitor may also be implemented on-chip.

With respect to the figures referenced in this disclosure, the dimensions for the various elements are not to scale; some dimensions have been greatly exaggerated vertically and/or horizontally for clarity or emphasis. In addition, references to orientations and directions (e.g., "top", "bottom", "above", "below", "lateral", "vertical", "horizontal", etc.) are relative to the example drawings, and not necessarily absolute orientations or directions.

Various embodiments of the invention can be implemented to meet a wide variety of specifications. Unless otherwise noted above, selection of suitable component values is a matter of design choice. Various embodiments of the invention may be implemented in any suitable integrated circuit (IC) technology (including but not limited to MOSFET structures), or in hybrid or discrete circuit forms. Integrated circuit embodiments may be fabricated using any suitable substrates and processes, including but not limited to standard bulk silicon, high-resistivity bulk CMOS, silicon-on-insulator (SOI), and silicon-on-sapphire (SOS). Unless otherwise noted above, embodiments of the invention may be implemented in other transistor technologies such as bipolar, BiCMOS, LDMOS, BCD, GaAs HBT, GaN HEMT, GaAs pHEMT, and MESFET technologies.

However, embodiments of the invention are particularly useful when fabricated using an SOI or SOS based process, or when fabricated with processes having similar characteristics. Fabrication in CMOS using SOI or SOS processes enables circuits with low power consumption, the ability to withstand high power signals during operation due to FET stacking, good linearity, and high frequency operation (i.e., radio frequencies up to and exceeding 300 GHz). Monolithic IC implementation is particularly useful since parasitic capacitances generally can be kept low (or at a minimum, kept uniform across all units, permitting them to be compensated) by careful design.

Voltage levels may be adjusted, and/or voltage and/or logic signal polarities reversed, depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functionality without significantly altering the functionality of the disclosed circuits.

Circuits and devices in accordance with the present invention may be used alone or in combination with other components, circuits, and devices. Embodiments of the present invention may be fabricated as integrated circuits (ICs), which may be encased in IC packages and/or in modules for case of handling, manufacture, and/or improved performance. In particular, IC embodiments of this invention are often used in modules in which one or more of such ICs are combined with other circuit blocks (e.g., filters, amplifiers, passive components, and possibly additional ICs) into one package. The ICs and/or modules are then typically combined with other components, often on a printed circuit board, to form part of an end product such as a cellular telephone, laptop computer, or electronic tablet, or to form a higher-level module which may be used in a wide variety of products, such as vehicles, test equipment, medical devices, etc. Through various configurations of modules and assemblies, such ICs typically enable a mode of communication, often wireless communication.

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, and/or parallel fashion.

It is to be understood that the foregoing description is intended to illustrate and not to limit the scope of the invention, which is defined by the scope of the following claims, and that other embodiments are within the scope of the claims. In particular, the scope of the invention includes any and all feasible combinations of one or more of the processes, machines, manufactures, or compositions of matter set forth in the claims below. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

The invention claimed is:

1. A circuital arrangement comprising an integrated circuit (IC), the IC comprising:
   a shunt switch;
   a decoupling capacitance connecting a source terminal of the switch to a first pin of the IC;
   a storage capacitance disposed outside the IC and coupled to the first pin of the IC;

a resonance-canceling inductance disposed outside the IC and in series with the storage capacitance;
wherein:
the storage capacitance acts as an alternating current (AC)-short circuit across an operational frequency band of the IC;
the resonance-canceling inductance is configured to cancel or attenuate a parasitic resonance, by a combination of i) a series arrangement of a parasitic ground inductance inside the IC and a parasitic ground inductance outside the IC with ii) a parallel arrangement of the decoupling capacitance and a parasitic capacitance, the parasitic resonance to be canceled or reduced occurring at a frequency within an operational frequency band of the circuital arrangement.

2. The circuital arrangement of claim 1, further comprising a resistor, the resistor being disposed inside the IC, in series with the decoupling capacitance and connected to the first pin of the IC.

3. The circuital arrangement of claim 2, wherein the resistor includes an adjustable resistor.

4. The circuital arrangement of claim 1, wherein the resonance-canceling inductance is disposed upstream of the storage capacitance.

5. The circuital arrangement of claim 1, wherein the resonance-canceling inductance is disposed downstream of the storage capacitance.

6. The circuital arrangement of claim 1, further comprising a first electrostatic discharge (ESD) device, the first ESD device being disposed outside the IC and connected to the first pin of the IC.

7. The circuital arrangement of claim 6, wherein the IC further comprises a second pin, and wherein input/output (I/O) devices outside the IC are connected to the second pin.

8. The circuital arrangement of claim 7, further comprising a second ESD device being disposed outside the IC and connected to the second pin.

9. The circuital arrangement of claim 7, wherein the parasitic capacitance includes a parasitic capacitance of the first ESD device.

10. The circuital arrangement of claim 1, wherein the IC is disposed on a printed circuit board (PCB), and wherein the parasitic ground inductance outside the IC is a PCB ground impedance.

11. The circuital arrangement of claim 1, wherein the resonance-canceling inductance includes a digitally tunable inductor.

12. The circuital arrangement of claim 1, wherein the decoupling capacitance includes a digitally tunable capacitor.

13. A circuital arrangement comprising an integrated circuit (IC), the IC comprising:
   a shunt switch;
   a decoupling capacitance connecting a source terminal of the switch to a first pin of the IC;
   a storage capacitance disposed outside the IC and coupled to the first pin;
   a resonance-canceling inductance disposed inside the IC and in series with the decoupling capacitance;
wherein:
the storage capacitance acts as an alternating current (AC)-short circuit across an operational frequency band of the IC;
the resonance-canceling inductance is configured to cancel or attenuate a parasitic resonance, by a combination of i) a series arrangement of a parasitic ground inductance inside the IC and a parasitic ground inductance outside the IC with ii) a parallel arrangement of the decoupling capacitance and a parasitic capacitance, the parasitic resonance to be canceled or reduced occurring at a frequency within an operational frequency band of the circuital arrangement.

14. The circuital arrangement of claim 13, further comprising a resistor, the resistor being disposed inside the IC, in series with the decoupling capacitance and the resonance-canceling inductance, the resistor being connected to the first pin of the IC.

15. The circuital arrangement of claim 13, further comprising a first electrostatic discharge (ESD) device, the first ESD device being disposed outside the IC and connected to the first pin of the IC.

16. The circuital arrangement of claim 13, wherein the IC is disposed on a printed circuit board (PCB), and wherein the parasitic ground inductance outside the IC is a PCB ground impedance.

17. The circuital arrangement of claim 13, wherein the resonance-canceling inductance includes a digitally tunable inductor.

18. The circuital arrangement of claim 17, further including a resistor disposed in series with the decoupling capacitance.

19. A circuital arrangement comprising an integrated circuit (IC), the IC comprising:

a shunt switch;

a decoupling capacitance connecting a source terminal of the switch to a first pin of the IC;

a storage capacitance disposed outside the IC and coupled to the first pin of the IC;

a resistor disposed inside the IC and in series with the storage capacitance;

wherein:

the storage capacitance acts as an alternating current (AC)-short circuit across an operational frequency band of the IC;

the resistor is configured to attenuate a parasitic resonance, by a combination of i) a series arrangement of a parasitic ground inductance inside the IC and a parasitic ground inductance outside the IC with ii) a parallel arrangement of the decoupling capacitance and a parasitic capacitance, by spreading the parasitic resonance across an operational frequency band of the circuital arrangement.

20. The circuital arrangement of claim 19, wherein the resistor is an adjustable resistor.

21. A method of canceling or attenuating a resonance generated in a radio frequency (RF) integrated circuit (IC) circuit, the IC including:

a shunt switch, and a decoupling capacitance connecting a source terminal of the switch to a pin of the IC; the method comprising:

connecting, outside the IC, a storage capacitance to the pin of the IC, the storage capacitance being an alternating current (AC)-short across an operational frequency band of the IC;

applying an input RF voltage to a drain terminal of the shunt switch, thereby generating a parasitic resonance based on a combination of i) a series arrangement of a parasitic ground inductance inside the IC and a parasitic ground inductance outside the IC with ii) a parallel arrangement of the decoupling capacitance and a parasitic capacitance;

disposing a resonance-canceling inductance outside the IC and in series with the storage capacitance to cancel or attenuate the parasitic resonance.

\*    \*    \*    \*    \*